United States Patent [19]

Townsend et al.

[11] Patent Number: 4,713,553
[45] Date of Patent: Dec. 15, 1987

[54] FAST POWER-FAIL DETECTOR FOR POWER SUPPLIES WITH ENERGY HYSTERESIS

[75] Inventors: Greg M. Townsend, Palatine; Giuseppe M. DiPrizio, Glendale Heights, both of Ill.

[73] Assignee: Motorola Inc., Schaumburg, Ill.

[21] Appl. No.: 789,866

[22] Filed: Oct. 21, 1985

[51] Int. Cl.$^4$ .................. G01R 23/16; H03K 5/20
[52] U.S. Cl. ........................ 307/64; 307/66; 307/87; 307/310; 328/149; 361/92; 361/93; 324/77 A
[58] Field of Search .......... 307/64, 66, 83, 86, 307/87, 310; 324/76 R, 78 R, 78 D, 78 E, 77 A, 51, 52; 361/18, 21, 33, 37, 56, 59, 60, 64, 65, 79, 82, 86, 87, 88, 90, 91, 92, 93, 106, 125, 54, 63, 67, 89, 109; 328/146, 149, 150

[56] References Cited

U.S. PATENT DOCUMENTS

| | | | |
|---|---|---|---|
| 3,588,535 | 6/1971 | Hellstrom | 307/310 X |
| 3,911,360 | 10/1975 | Kimzey | 361/92 X |
| 3,937,937 | 2/1976 | McVey | 361/92 X |
| 4,000,446 | 12/1976 | Vandevier et al. | 361/92 X |
| 4,007,425 | 2/1977 | Salisbury | 307/310 X |
| 4,031,463 | 6/1977 | Norberg | 361/86 X |
| 4,031,464 | 6/1977 | Norberg | 361/92 X |
| 4,063,301 | 12/1977 | Lye | 361/88 |
| 4,245,150 | 1/1981 | Driscoll et al. | 361/92 X |
| 4,251,883 | 2/1981 | Grants et al. | 361/92 X |
| 4,262,214 | 4/1981 | Patel | 361/92 X |
| 4,272,816 | 6/1981 | Matsumoto | 361/79 X |
| 4,309,623 | 1/1982 | Iwatani et al. | 361/92 X |
| 4,331,995 | 5/1982 | Voss | 361/92 X |
| 4,375,072 | 2/1983 | Rice | 361/93 X |
| 4,376,968 | 3/1983 | Wueschinski et al. | 361/92 X |
| 4,394,702 | 7/1983 | Boothe | 361/92 |
| 4,428,020 | 1/1984 | Blanchard | 361/92 X |
| 4,429,236 | 1/1984 | Nitschke | |
| 4,447,841 | 5/1984 | Kent | 361/92 X |
| 4,466,041 | 8/1984 | Witulski et al. | 361/93 |
| 4,502,086 | 2/1985 | Ebisaka | 361/67 X |
| 4,507,795 | 3/1985 | Wagner | 328/149 X |
| 4,535,410 | 8/1985 | O'Mara | |

FOREIGN PATENT DOCUMENTS 1254975 11/1971 United Kingdom .

Primary Examiner—William M. Shoop, Jr.
Assistant Examiner—Shik Luen Paul Ip
Attorney, Agent, or Firm—F. John Motsinger; Edward M. Roney; Donald B. Southard

[57] ABSTRACT

A system for rapidly detecting power disturbances with ferroresonant transformers having a decay profile comprising the steps of rectifying a power signal; comparing the rectified signal against a reference signal; comparing the rectified signal against a dynamic reference signal; and generating a power-fail signal in response to either comparison falling below its respective reference.

36 Claims, 9 Drawing Figures

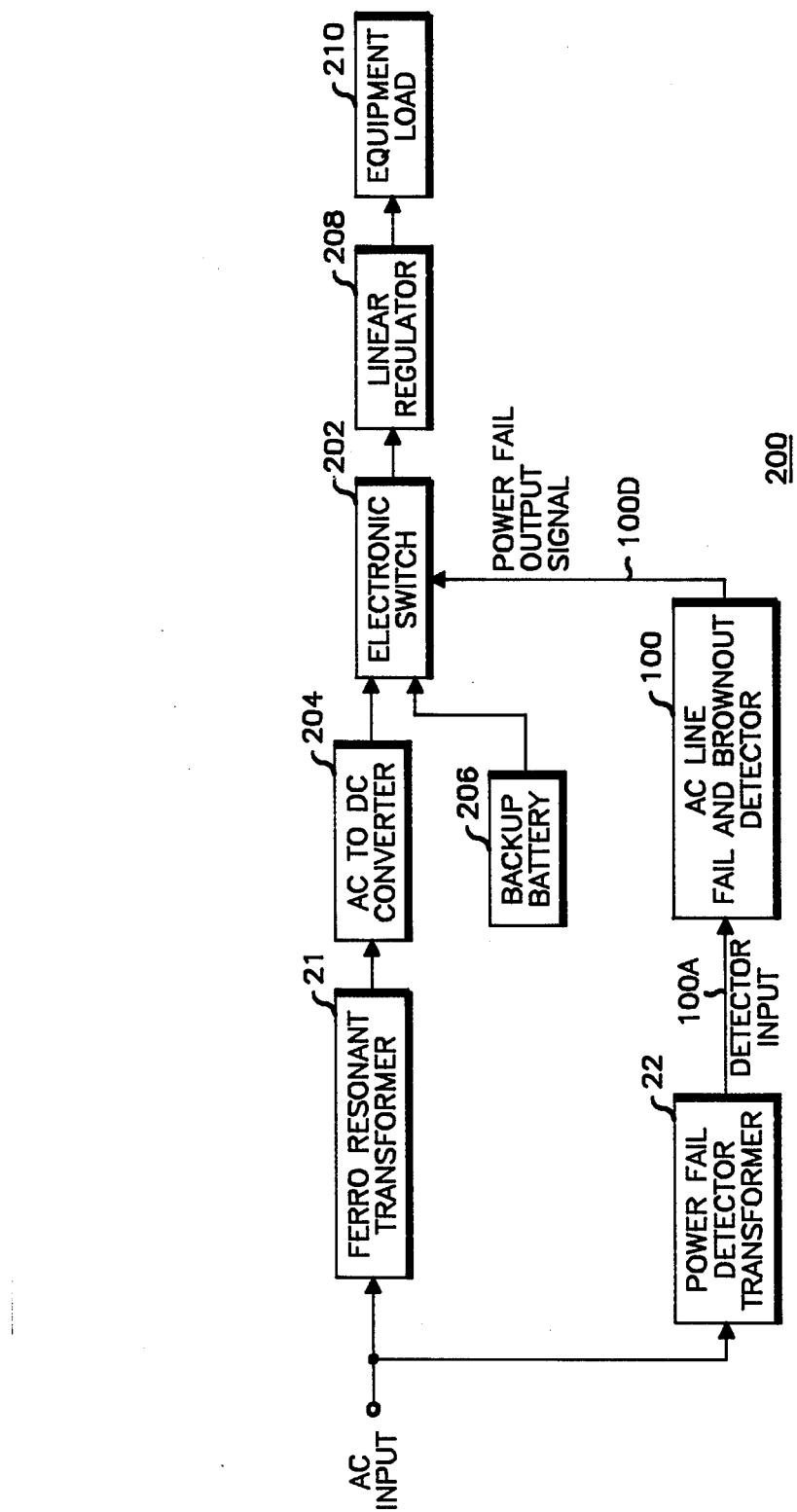

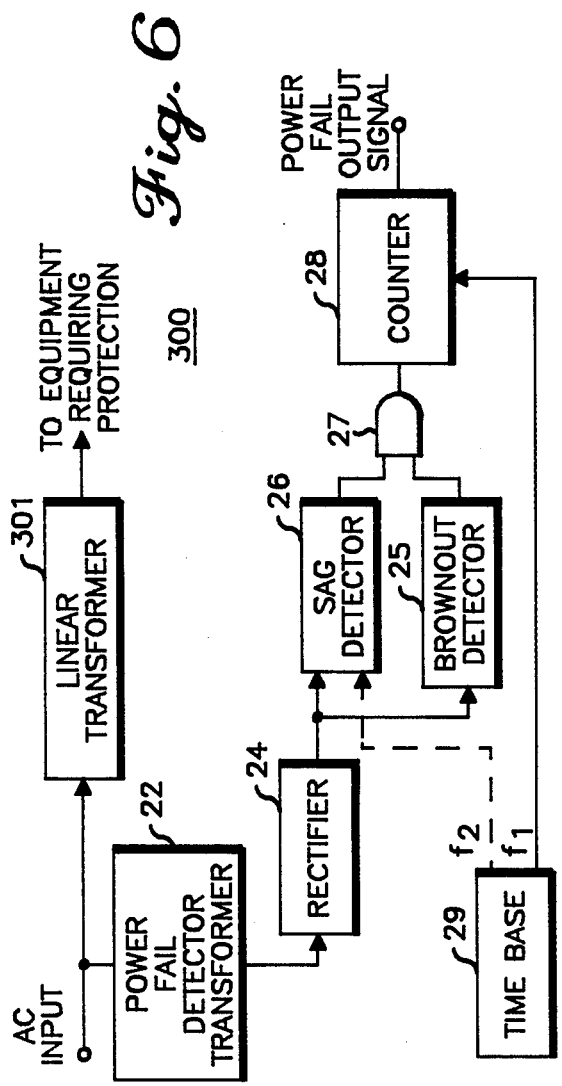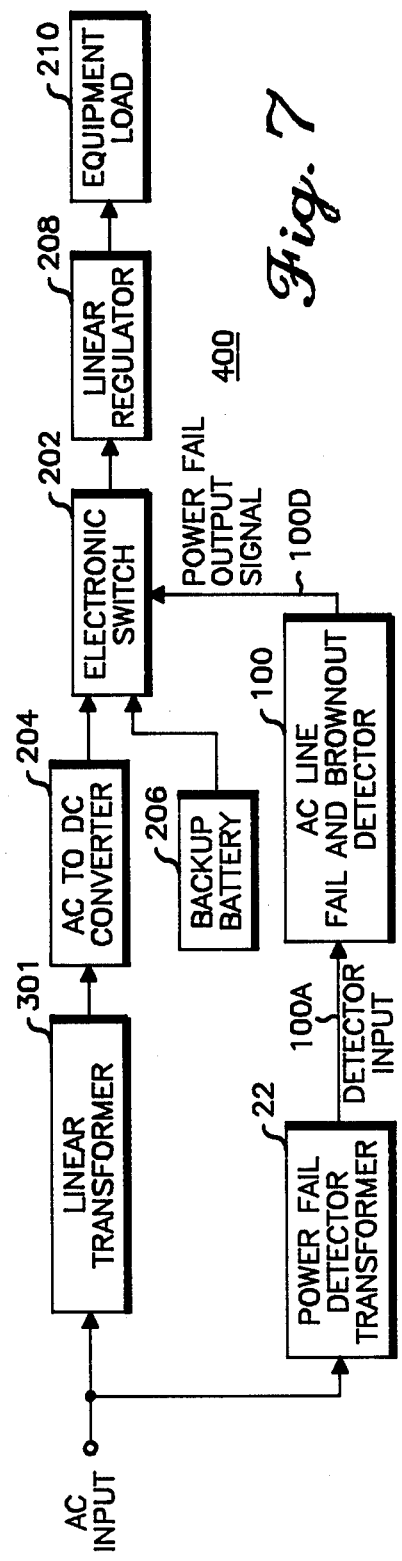

FAST POWER-FAIL DETECTOR FOR POWER SUPPLIES WITH ENERGY HYSTERESIS

THE FIELD OF INVENTION

The invention disclosed herein is, generally, concerned with power-fail detection.

More particularly, this invention relates to fast power-fail detection for ferroresonant power supplies and battery backup for volatile memories.

BACKGROUND OF THE INVENTION

Practically all electronic equipment being designed today must meet ever-more-stringent design. requirements, such as higher efficiency, smaller size, and immunity to power line variations. These constraints have been brought about by rising energy costs and the greater frequency of occurrence of a "brown-out" condition, where the voltage is deliberately reduced by some amount, or a "black-out" condition, which is an outright failure of the line voltage. Therefore, in order to protect equipment from the harmful consequences of such occurrences, it is necessary to provide a signal warning about the power fail condition. This is especially true for equipment such as electronic computing equipment which contains volatile memory and requires particularly fast warning concerning such occurrences, so that steps can be taken to maintain the operation of the equipment in an uninterrupted fashion or at least take measures to protect the information stored in the volatile memory.

One known detection method widely used consists of detecting when the peak of an AC line cycle has dropped below a preselected level and then generating a power fail signal when too many of such low voltage cycles occur within an arbitrary time period. An exemplary solution, illustrated in FIG. 1a, involves a brownout detector 10 (full wave rectifier 12, comparator 13 and missing pulse detector 15/16) to sense AC power failures. Such a detector is an improvement over a simple black-out detector which merely has a comparator for determining when the AC line voltage has dropped below a preselected level, and is well-known in the art. While either arrangement is suitable for some equipment designs, each assumes that the power supply contains a sufficiently large filter capacitor and a linear transformer having minimal energy-storage characteristics for interfacing with the AC line voltage.

The first disadvantage is that the power supplies themselves do not achieve efficiency levels and physical size requirements demanded by the design constraints of today's equipment.

One solution would be to increase the capacitance and hold time of the series pass regulator 208. The result would be a series pass regulator 208 that is operated farther from saturation and, therefore, less efficiently, at greater cost and with greater heat dissipation.

A second disadvantage of either of such arrangements especially when using a ferroresonant transformer is that the detection methods prove to be too slow to be effective during an AC line fail condition because the stored energy in a ferroresonant transformer 21 is dumped back into the AC power lines when the power is interrupted. Thus, ferroresonant transformers 21 present a sinusoid with an exponentially decaying envelope that continues to fool the missing pulse detectors 15/16 for up to 50 ms after an actual power failure.

Ferroresonant power supply transformers 21 are highly efficient because they, inherently, provide a constant output voltage. However, absent any active feedback, ferroresonant power supplies provide poor load regulation.

At the sacrifice of some power supply efficiency, effective load regulation can be achieved by following the ferroresonant transformer with a linear series pass regulator 208. Not much efficiency is sacrificed, however, when the series pass regulator 208 is operated very near saturation. However, in the nearly saturated series pass regulator, its internal filter capacitor offers very little hold time in the event of a power failure.

In installations having volatile memories, the short hold time of the filter capacitor in the nearly saturated series pass regulator 208 does not provide much time (worst case, 14 milliseconds) to respond with battery backup before the output falls out of regulation.

The need for this invention arose from problems of fast power-fail detection with ferroresonant power supplies and battery backup for volatile memories.

What is required, then, is a faster AC power fail detector.

The instant invention solves the problem by ANDing 27 a sag detector 26 with the brownout detector 25 before the missing pulse detector 28/29.

This invention represents a significant advance over the prior art and over this technical field by providing a fast power-fail detector for ferroresonant power supplies including, in combination, a brownout detector and sag detector.

BRIEF SUMMARY OF THE INVENTION

It is the object of the present invention to provide a fast power-fail detector for ferroresonant power supplies including, in combination, a brownout detector and sag detector.

It is a further object of the invention to provide a regulated ferroresonant power supply that is highly efficiently, at a moderate cost with minimal heat dissipation.

Yet another object of the present invention is to provide a fast power-fail detector for ferroresonant power supplies that is applicable for battery backup in installation having volatile memories.

It is an object of the present invention to provide an improved, high speed AC line-fail and brown-out detection apparatus useful for protecting equipment containing a ferroresonant transformer and which overcomes the foregoing deficiencies.

It is a further object of the present invention to provide an improved, AC line-fail and brown-out detection apparatus of the foregoing type useful for protecting equipment having a high efficiency power supply incorporating a ferroresonant transformer and providing a high speed power fail output signal within a fraction of a cycle to maintain uninterrupted operation of the equipment.

It is a further object of the present invention to provide an improved AC line-fail and brown-out detection apparatus of the foregoing type useful for protecting equipment having a linear power supply transformer.

In practicing the invention, an AC line-fail and brown-out detection apparatus is provided which includes a rectifier, a two-part voltage detector having a logic gate, and a missing pulse detector which includes a counter and a timebase. The rectifier is interfaced with the incoming AC line by a power fail detector transformer. The equipment requiring protection is interfaced with the AC line by use of a ferroresonant transformer incorporated into a highly efficient power supply. This type of transformer exhibits an energy-storage capability and also provides some filtering against line noise. The two-part voltage detector consists of a brown-out detector, which utilizes a fixed reference to detect an absolute minimum operating voltage, and a sag detector, which utilizes a dynamically determined reference limit to detect a rate-of-decrease in the waveform provided by the rectifier. Each of these detectors provides an output pulse train when the incoming waveform is above its respective limit. The logic gate combines each of the outputs from the voltage detectors, generates an output pulse train when both pulses are present, and then provides this combined output as the reset signal to the missing pulse detector counter. The power fail output signal occurs when the missing pulse detector counter exceeds the nominal count value achieved between the regular occurrences of the reset signal which normally resets the counter in the missing pulse detector. With the sag detector being incorporated into the two-part voltage detector along with the included brown-out detector, the preferred embodiment of the present invention overcomes the disadvantages of the known prior art. That is, the sag detector operates as an adaptive time rate-of-decrease voltage detector and consists of at least a variable-gain stage, a voltage comparator, and a variable attenuator cooperating to form an AGC (automatic gain control) loop to achieve high speed detection of an AC line-fail or brown-out condition in a power supply having a ferroresonant transformer. Another embodiment of the present invention utilizes the high speed AC line-fail and brown-out detector to switch the equipment from the ferroresonant transformer supply to another source of supply, such as a back-up battery, to achieve uninterrupted operation of the equipment. The result of using either of these two arrangements incorporating the high speed detector of the present invention is protection of the equipment. Moreover, the detector of the present invention is also usable in equipment having linear power supply transformers.

In accordance with the present invention, there is provided a system for rapidly detecting power disturbances with ferroresonant transformers having a decay profile comprising the steps of rectifying a power signal; comparing the rectified signal against a reference signal; comparing the rectified signal against a dynamic reference signal; and generating a power-fail signal in response to either comparison falling below its respective reference.

Thus, there has been provided a fast power-fail detector for ferroresonant power supplies including, in combination, a brownout detector and sag detector.

BRIEF DESCRIPTION OF THE DRAWINGS

Additional objects, features, and advantages, in accordance with the present invention, will be more clearly understood, by way of unrestricted example, from the following detailed description, taken together with the accompanying drawings, in which:

FIG. 5 is a block diagram of another arrangement embodying the present invention wherein the power fail output signal is utilized to uninterruptibly maintain the operation of the equipment.

FIG. 6 is a block diagram of still another arrangement embodying the present invention for equipment having a linear power supply transformer.

FIG. 7 is a block diagram of yet another arrangement embodying the present invention wherein the power fail output signal is utilized to uninterruptibly maintain the operation of equipment having a linear power supply transformer. de The invention will be readily appreciated by reference to the detailed description when considered in conjunction with the accompanying drawings in which like reference numerals designate like parts throughout the figures.

THE DESCRIPTION OF THE PREFERRED EMBODIMENT

Figure 1A:
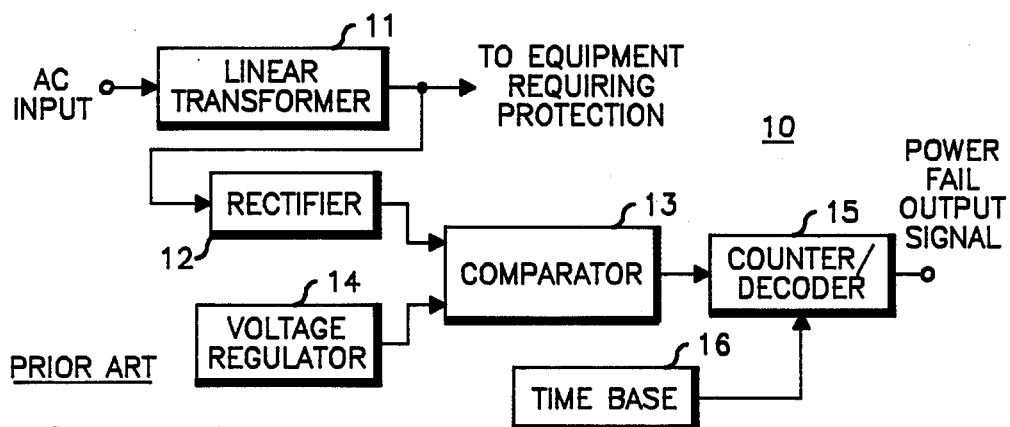
FIG. 1a is a block diagram of a typical brown-out detector arrangement to be found in the prior art.
Figure 1B:
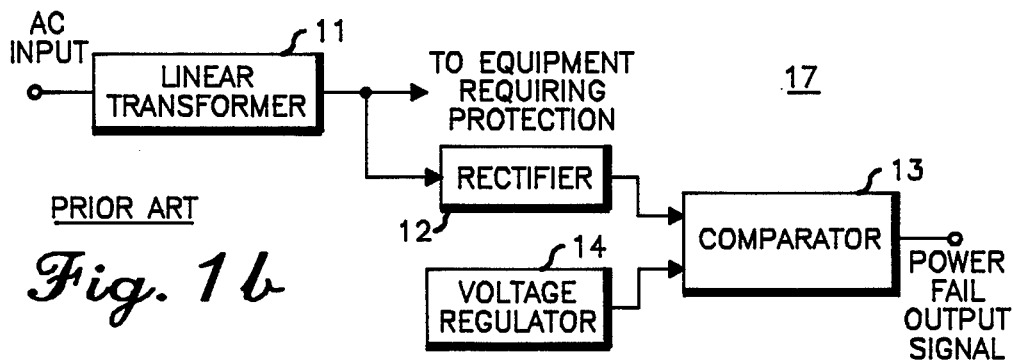
FIG. 1b is a block diagram of a typical black-out detector arrangement to be found in the prior art.

Referring now to the drawings, a brown-out detector which is typical of the prior art is shown at 10 in FIG. 1a. As indicated, this detector includes a linear transformers 11, a rectifier 12, and a comparator 13 having a voltage regulator reference 14. The output of comparator 13 feeds counter-decoder 15 which has a time base 16 for generating a power fail output signal. A black-out detector, also typical of the prior art, is shown at 17 in FIG. 1b. It consists of a linear transformer 11, a rectifier 12, and a comparator 13 having a voltage regulator reference 14. The comparator 13 generates the power fail output signal.

Each of these voltage detectors 10 and 17 is subject to all of the previously enumerated deficiencies set forth with some particularity in the background of the invention. This is, while each detector may be sufficiently fast in detecting abnormal line conditions in equipment utilizing linear transformers, each of these detectors cannot quickly detect an AC line-fail or brown-out condition in equipment utilizing a ferroresonant transformer having an energy-storage characteristic which causes a delayed detection response. Moreover, each detector 10 and 17 only relies on a fixed, predetermined reference voltage.

Figure 2:
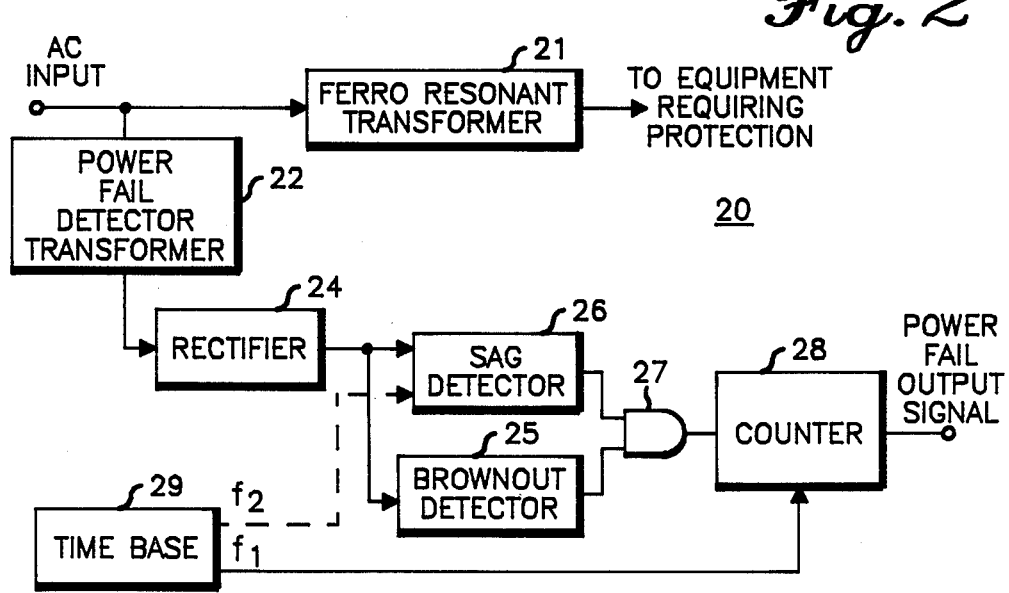
FIG. 2 is a block diagram of a high speed AC line-fail and brown-out detector arrangement illustrating the simplest form of the present invention.

FIG. 2 is a block diagram illustrating a fast power-fail detector for ferroresonant power supplies including, in combination, a brownout detector and sag detector, which incorporates the present invention.

The fast power-fail detector consists of a full wave rectifier 24, a brownout detector 25 ANDed 27 together with a sag detector 26 and a missing pulse detector 28/29. The full wave rectifier 24 rectifies the AC power into a rectified waveform. The rectified waveform is directed to the brownout detector 25 and the sag detector 26. The brownout detector 25 pulses for so long as the rectified waveform exceeds a fixed brownout threshold. Similarly, the sag detector 26 pulses for so long as the rectified waveform exceeds a dynamic reference—a moving average of the input waveform—that changes slowly relative to the decaying sinusoid generated by the ferroresonant transformer 21 dumping its stored energy back into the failed AC power mains. The missing pulse detector 28/29 (e.g., Johnson Ring Counter) and the AND gate 27 signal a power failure due to either a power brownout, sag or complete failure.

In this embodiment as depicted at 20, a non-linear ferroresonant transformer 21 provides power to the equipment. A separate power fail detector transformer 22, which exhibits linear voltage-ratio characteristics, provides an input to the high speed AC line-fail and brown-out detector. The detector includes a rectifier 24 feeding a two-part voltage detector comprising brownout detector 25 of conventional design having a fixed minimum voltage and sag detector 26 having an adaptive, or dynamic, rate-of-decrease voltage detector characteristic. Each voltage detector provides an output combined in logic gate 27 which feeds a missing pulse detector consisting of counter 28 having time base 29 for providing a clock frequency $f_1$. A separate time base frequency $f_2$ derived from time base 29 may also be used by the sag detector 26, if needed. The sag detector 26 includes a variable-gain stage, a comparator, and a monostable, connected in an AGC loop having a relatively slow RC (resistor-capacitor) time constant for dynamically establishing a moving-average voltage with which to detect any rate-of-decrease in the envelope of the incoming AC line voltage, and thus permits relatively fast indication of an AC line failure or brown-out condition.

Figure 3:
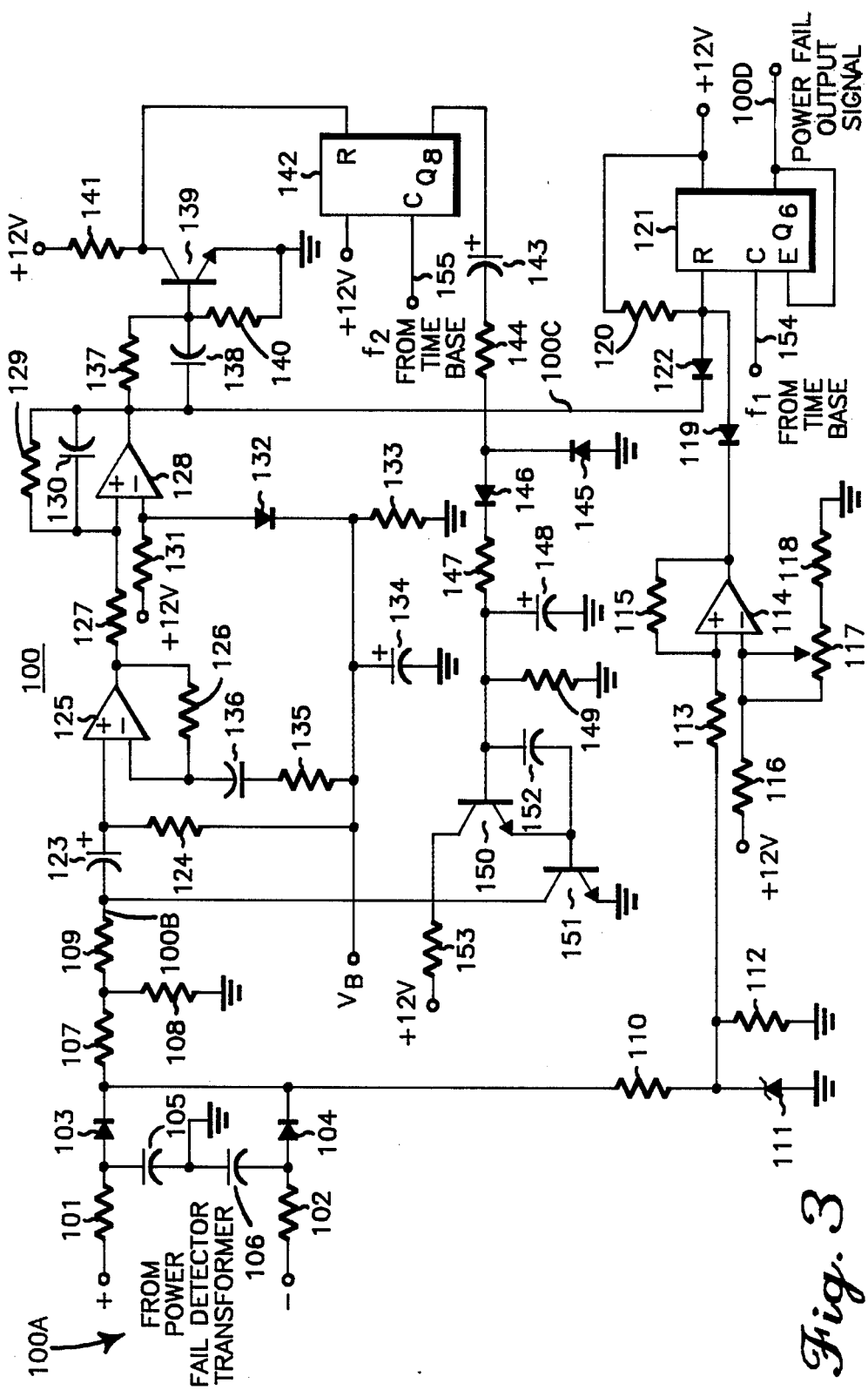
FIG. 3 is a schematic diagram of a full-wave rectifier, brown-out detector, sag detector, logic gate, and a counter embodied in the present invention as represented in functional form in FIG. 2, and relatively insensitive to temperature variations by utilizing a counter as a monostable to effect a pulse delay in the sag detector's AGC loop.

FIG. 3 is a circuit diagram illustrating a fast power-fail detector for ferroresonant power supplies including, in combination, a brownout detector and sag detector, which incorporates the preferred embodiment of the present invention.

The AC power 100A is applied to a full wave rectifier (101–106). The rectified waveform is applied to a voltage comparator 114 and compared against a reference brownout threshold (116–118) established by potentiometer 117. The voltage comparator 114 pulses high on positive peaks of the rectified waveform.

The rectified waveform is also applied to a sag detector. The sag detector includes a variable gain amplifier 125 and a voltage comparator 128 inside an Automatic Gain Control (AGC) loop. The variable gain amplifier 125 provides the gain variability for the automatic gain control loop in response to changes in signal shunt 151. The comparator 128 pulses when the amplified, rectified waveform exceeds the reference voltage of circuitry 131, 132 and 133 and establishes a dynamic reference voltage based upon a moving average of the input waveform. Automatic gain control (AGC) is realized by the signal shunt 151. When the magnitude of the rectified waveform increases, the pulse width from the comparator 128 increases, turning the shunt 151 on harder and shunting more of the rectified waveform. Similarly, when the magnitude of the rectified waveform decreases, the pulse width from the comparator 128 decreases, decreasing the amount of the rectified waveform that is shunted 151. The AGC time constant and, therefore, the speed of the gain change are established by 148 and 149 and are chosen to be long relative to the decay profile of the ferroresonant transformer 21. When the rectified waveform falls according to the approximated decay profile of the ferroresonant transformer, the comparator 128 no longer pulses.

The wired AND gate (119, 120 & 122) detects the absence of either the brownout detector signal or the sag detector signal and is coupled to the missing pulse detector 121. The missing pulse detector, properly clocked 154, signals 100D a power failure upon a missed pulse—the AND circuit must reset the ring counter 121 before the 60 Hz (or 50 Hz) count Q6 (or Q7) is exceeded. Thus, the missing pulse detector 121 (e.g., Johnson Ring Counter) and the AND gate 100D signal a power failure due to either a power brownout, sag or complete failure.

Considering each of the functional blocks beginning with rectifier 24 of previous FIG. 2, the input signal from the power fail detector transformer is applied to the input 100A through resistors 101, 102 and diodes 103, 104 with capacitors 105, 106 which comprise a full-wave rectifier circuit.

The output from the full-wave rectifier circuit is taken through a level adjust "T" network formed by resistors 107, 108, and 109 which feed the sag detector circuitry via line 100B. The full-wave rectifier output is also fed to the brown-out detector circuitry given by resistor 110, zener diode 111, resistor 112, resistor 113 feeding comparator 114 having a feedback resistor 115 and a preset reference voltage established by an included 12 volt supply feeding a divider network formed by resistor 116, potentiometer 117, and resistor 118. The output of the brown-out detector circuitry is fed to diode 119 which is part of the logic gate.

Returning to line 100B denoting the level adjust circuit output from resistor 109, the doubled waveform is applied to the sag detector circuitry having a connection to the variable attenuator circuitry (discussed below) and also coupling capacitor 123, which is connected along with resistor 124 to the positive input of amplifier 125. Amplifier 125, which has a feedback resistor 126 connected to its negative input, has its output taken through resistor 127 to the positive input of comparator 128 which has a parallel combination of resistor 129 and capacitor 130 connected in positive feedback fashion. Forming part of the reference voltage circuitry and connected to the negative input of comparator 128 is bias resistor 131 and the anode side of diode 132. The cathode side of diode 132 connects to ground via the parallel combination of resistor 133 and capacitor 134. The cathode side of diode 132 also connects to the return side of resistor 124 and the series combination of resistor 135 and capacitor 136, which then connects to the minus side of amplifier 125 and completes the reference voltage circuitry. The output of comparator 128 is taken via line 100C to the cathode side of diode 122 which is the other half of the logic gate.

This output is also taken to the parallel combination of resistor 137 and capacitor 138 feeding the base of inverter transistor 139 which has a resistor 140 connected from base to ground. The collector of transistor 139 has a resistor 141 connected to the 12 volt supply and is taken to the reset terminal of monostable stage 142. The Q8 output of monostable stage 142 is then fed back to form an AGC loop by feeding the series combination of capacitor 143 and resistor 144 driving the cathode side of diode 145 having its anode connected to ground and the anode side of diode 146 which has its cathode connected in series fashion to resistor 147. The other side of resistor 147 drives one side of the parallel combination of capacitor 148 and resistor 149 which controls the AGC loop time constant and which is connected to the base of a Darlington transistor arrangement 150, 151 having its emitter connected to ground. A capacitor 152 is connected from the base to emitter terminals of transistor 150 and a resistor supplies current from a 12 volt supply to the collector of transistor 150. The collector lead of transistor 151 is then connected back to the series connection of resistor 109 and capacitor 123 denoted as line 100B thereby forming a variable attenuator utilized in conjunction with amplifier 125 to form a variable gain stage for the AGC loop.

The output of the logic gate consists of connecting the anodes of diodes 122 and 119 together and connecting a resistor 120 to the 12 volt supply and further connecting the anodes of the diodes to the reset terminal of counter 121 (e.g., a Motorola MC 14017). Signal $f_1$, $f_2$ provided by the time base are supplied in separate fashion to counter 121 by means of line 154 connected to the clock terminal thereof, and line 155 to the clock terminal of monostable stage 142. The output of the AC line-fail and brown-out detector is then taken at line 100D.

In operation, the rectifier circuit provides a waveform having only positive (unipolar) pulses synchronized to the incoming AC line frequency. In this embodiment the rectifier circuit provides a full-wave rectified waveform having pulses occurring at twice the AC line frequency, although a half-wave rectifier having pulses occurring at the same rate as the AC line frequency could be used. Next, the waveform is sent to the two-part voltage detector, namely the brown-out detector and the sag detector. The brown-out detector has a voltage comparator 114 which outputs a high pulse for each peak of the input waveform proportional to the AC line voltage that exceeds a fixed, minimum reference voltage corresponding to the predetermined brown-out voltage. As long as the AC line voltage exceeds this minimum brown-out voltage, for example 96 volts, the brown-out detector outputs a pulse train to logic gate diode 119.

The sag detector operates in a different manner using comparator 128 for comparing the input waveform to voltage established by voltage circuitry 131, 132, 133. The sag detector also includes a variable-gain stage which has an amplifier 125 and a variable attenuator 109, 150, and 151 controlled by an AGC loop having a fast-attack time constant due to 147, 148 and a slow-release time constant due to 148,149. When comparator 128 pulses high at its output due to the input waveform exceeding the reference voltage of circuitry 131, 132, and 133, it establishes a dynamic reference voltage based upon a moving-average of the input waveform. Ignoring temperature-compensation stages 139 and 142 for the moment, the comparator output pulses of approximately 1 millisecond duration are rectified by 145, 146 and filtered by 147, 148, and 149. As these comparator output pulses vary, widening for an increasing waveform amplitude, and narrowing (or disappearing altogether) as the input waveform decreases, the dynamic reference voltage established at capacitor 148 also varies and controls the variable attenuation provided by shunt transistors 150, 151. Thus, as long as the input waveform has voltage peaks of increasing or constant value, the AGC loop has sufficient gain so that the comparator 128 output will pulse high for each peak of the waveform. If, however, the input waveform contains voltage peaks of decreasing value, the AGC gain change is restricted such that the comparator output will remain low for each such peak. As a result, the sag detector is able to detect a decaying sinusoidal waveform. The sag detector output 100C is then sent to logic gate diode 122 where it is combined with the output from the brown-out detector.

During normal operation, both 114 and 128 pulse high simultaneously every 8.3 milliseconds with a typical pulse width of 1 millisecond, thus resetting counter 121 before it reaches a count denoted Q6 (for 60 Hz systems). However, during an AC line-fail or brown-out condition, counter 121, fed by timebase frequency $f_1$ (such as 484 Hz) via line 154, will respond by counting up to Q6 when arrangement can also be made to operate in 50 Hz systems by utilizing Q7 as the output instead of Q6 on counter 121.

This preferred embodiment of the sag detector employs an inverter stage 139 and a counter 142, such as a Motorola MC14020, which is driven by timebase frequency $f_2$ (such as 124 kHz) forming a monostable stage 142 for minimizing temperature-induced gain variations in the AGC loop over the range of 0° to +70° Celcius, without the use of temperature-dependent components. This counter 142 effects a 1 millisecond delay in the leading edge of the comparator 128 output (without any delay in the trailing edge) and provides a relatively stable pulse width at output 128.

Figure 4A:
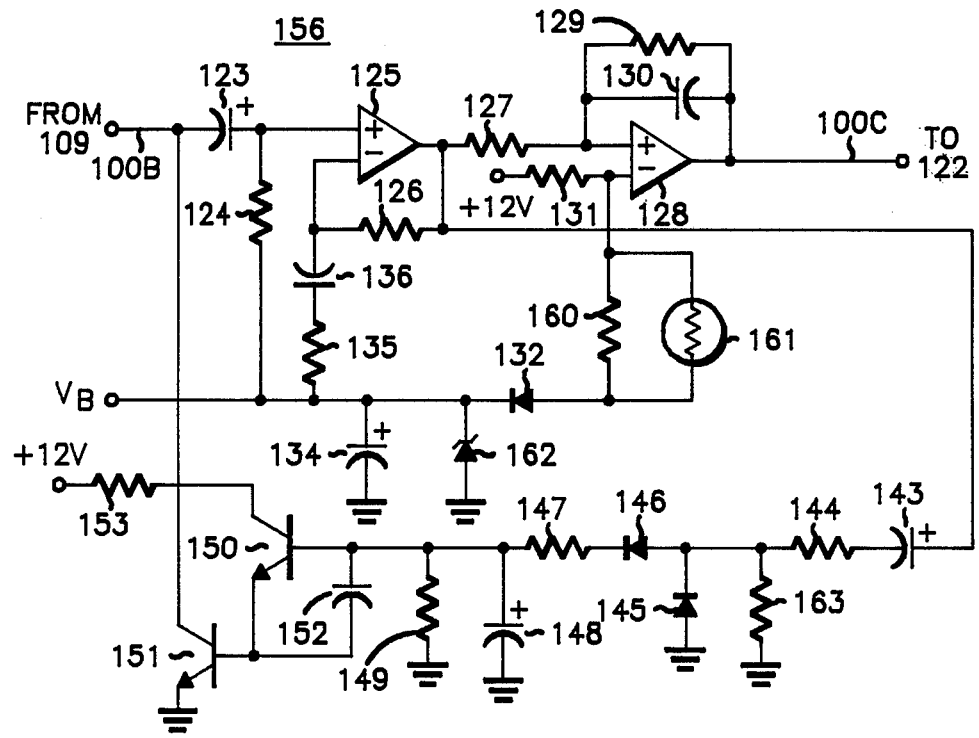
FIG. 4a is a schematic diagram of another embodiment of the sag detector utilizing a thermistor and a zener diode for compensating the AGC loop against temperature variations.
Figure 4B:
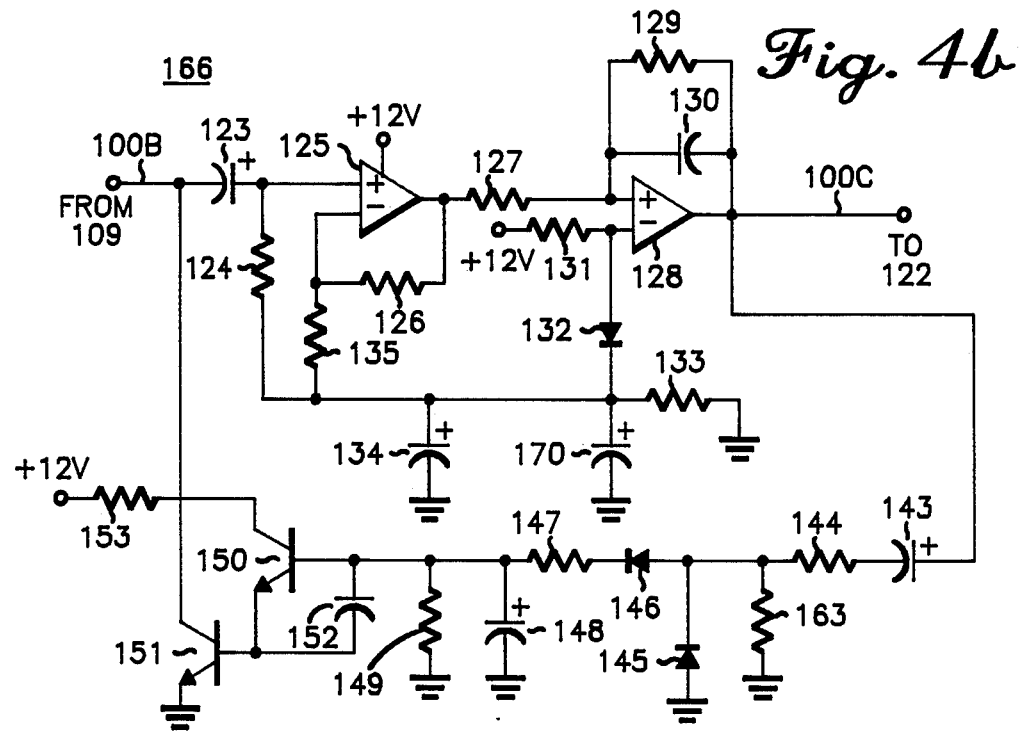
FIG. 4b is a schematic diagram of still another embodiment of the sag detector usable in environments having minimal temperature variations.

Alternate embodiments of the sag detector circuitry may be implemented in simplified form where temperature variations encountered are not as great. Two of such alternate embodiments are depicted in FIGS. 4a and 4b. Depicted first at 156 as shown in FIG. 4a is a sag detector which has eliminated the inverter circuitry of transistor 139 and counter 142 from the circuitry of previous FIG. 3. Moreover, the variable attenuator within the AGC loop is driven in this embodiment by the output of the amplifier rather than the comparator. Beginning at line 100B the sag detector circuit takes its signal from the resistive network having resistor 109 as the series element, and outputs the sag detector output on line 100C which is derived from the comparator 128 output. Most of the electrical elements are the same with the exception of resistor 160 being in parallel with thermistor 161 and being connected as shown to the negative input of comparator 128 to effect temperature compensation. Also included in this alternate embodiment are zener diode 162 and shunt resistor 163 connected in paralle across the diode 145.

Depicted next at 166 in FIG. 4b is another alternate embodiment of the sag detector suitable for environments having minimal temperature variations. Here again, most of the elements are the same as previously described in FIGS. 3 and 4a with the exception that no monostable is used and no temperature compensation elements are shown. Resistive element 163 is retained, while another capacitor 170 is connected in parallel with resistor 133 as depicted at 166 in FIG. 4b. Furthermore, the output of the amplifier only goes to the plus input of the comparator stage, and the AGC loop signal is taken from the output of the comparator stage 128 as shown. Like before, line 100B represents the input to the sag detector and line 100C represents the sag detector output which drives diode 122 as one input of the logic gate. Depicted at 200 as shown in FIG. 5 is a complete system block diagram utilizing the AC line-fail and brown-out detector of the present invention. The power fail output signal from the detector provides fast switching of the equipment load from the AC line to a source of back-up power. The elements used in this system include a ferroresonant transformer 21 and a power fail detector transformer 22 which have their inputs connected to the AC line input. Power fail detector transformer 22 is a linear voltage-ratio transformer which provides a detector input to the AC line-fail and brown-out detector 100 via detector input line 100A. The power fail output signal is taken on line 100D and controls the conductive state of electronic switch 202 which selects power being supplied from the ferroresonant transformer 21 and converted in AC to DC conversion stage 204 or a source of back-up power, such as back-up battery 206, as shown. The output of electronic switch 202 is then regulated by means of linear regulator stage 208 to minimize voltage variations to the equipment load 210. Such an arrangement as depicted at 200 is essential for critical loads such as volatile memory loads within stage 210. Moreover, such an arrangement provides a highly efficient source of power provided by the AC input when no unsatisfactory condition exists.

Depicted at 300 as shown in FIG. 6 is a block diagram of the present invention incorporated into a power supply having a conventional linear transformer 301. The operation of the detector is the same as previously described above. The block diagram depicted at 400 in FIG. 7 shows another arrangement embodying the present invention wherein the power fail output signal is utilized to maintain uninterrupted operation of equipment having a linear transformer 301.

In summary, each of the above-mentioned arrangements 20 and 200 are able to accomplish the detection of an AC line-fail and brown-out condition in a high speed manner for protecting electrical equipment being supplied through a ferroresonant transformer. Equipment utilizing such arrangements derive their power from the AC input in a high efficiency manner, and yet are able to be protected from AC line-fail and brown-out conditions which would be difficult to detect without the benefit of the high speed detector disclosed above. Thus, this detector is able to overcome the limitations of the known prior art and yet it is still usable with power supplies having linear transformers, as shown at 300 and 400.

Thus, there has been provided a fast power-fail detector for ferroresonant power supplies including, in combination, a brownout detector and sag detector.

Further there has been provided a regulated ferroresonant power supply that is highly efficient, at a moderate cost with minimal heat dissipation.

It will be appreciated by those skilled in the art of power-fail detection that a Johnson Ring Counter is but one of many missing pulse detectors and that a variety of other monostables, comparators and AGC configurations might be envisioned.

The foregoing description of the various embodiments are merely illustrative of the broad inventive concept comprehended by the invention and has been given for clarity of understanding by way of unrestricted example. However, it is not intended to cover all changes and modifications which do not constitute departures from the spirit and scope of the invention.

What is claimed is:

1. A method for rapidly detecting power signal disturbances in power systems with transformers having energy storage decay profiles, the method comprising the steps of:
    comparing the power signal against a dynamic reference signal;
    comparing the power signal against a relatively absolute reference signal; and
    generating a power-fail signal in response to either comparison approximating its respective reference, whereby the dynamic reference signal decay is long relative to the transformer energy storage decay profile and the power-fail signal indicates a power disturbance.

2. A fast power signal disturbance detector in power systems with transformers having energy storage decay profiles, the detector comprising:
    means for comparing the power signal against a dynamic reference signal;
    means for comparing the power signal against a relatively absolute reference; and
    means for generating a power-fail signal in response to either comparison approximating its respective reference,
    whereby the dynamic reference signal decay is long relative to the transformer energy decay profile and the power-fail signal indicates a power disturbance.

3. A fast power signal disturbance detector in power systems with ferroresonant transformers having energy storage decay profiles comprising:
    means for full wave rectifying a power signal;
    means for comparing the rectified power signal against a dynamic reference signal including
        a comparator in a variable gain controlled loop;
    means for comparing the rectified power signal against a relatively absolute reference signal; and
    means for generating a power-fail signal in response to either comparison approximating its respective reference further comprising:
        an AND gate having one input coupled to the dynamic reference comparator, another input coupled to the relatively absolute reference comparator and an output, and
        a Johnson ring counter missing pulse
    detector coupled to the AND gate output.

4. A method for fast power disturbance detection as claimed in claim 1, further comprising:
    controlling, with variable gain, the step of comparing the power signal against a dynamic reference signal.

5. A method for fast power disturbance detection as claimed in claim 4 further including:
    compensating temperature-induced variations associated with the step of controlling, with variablegain the power signal against a dynamic reference signal.

6. A method for fast power disturbance detection as claimed in claim 1 further comprising the step of: switching to an alternate power source in response to the generated power-fail signal.

7. A method for fast power disturbance detection as claimed in claim 1 wherein:
    the power signal is rectified.

8. An AC line-fail and brown-out voltage detection apparatus for protecting equipment utilizing a ferroresonant transformer, said apparatus comprising in combination:

rectification means for providing a unipolar waveform having a magnitude proportional to the incoming AC line voltage and synchronized to the frequency thereof;

missing pulse detection means for normally receiving a pulse train and generating a power fail output signal upon receipt of a pulse train having a missing pulse; and two-part voltage detection means interposed between said rectification means and said missing pulse detection means for detecting the magnitude and rate-of-decrease of said waveform with respect to fixed and dynamically determined limits and outputting a pulse train having a missing pulse when said waveform is below said limits, thereby providing a fast power fail output signal for protecting said equipment.

9. The apparatus according to claim 8 wherein said rectification means includes full-wave rectification means.

10. The apparatus according to claim 8 wherein said rectification means includes half-wave rectification means.

11. The apparatus according to claim 8 wherein said missing pulse detection means includes resettable counter means operating in conjunction with time base means for monitoring said combined output pulse train at a clock rate substantially greater than the frequency of said waveform.

12. The apparatus according to claim 8 wherein said two-part voltage detection means includes:

brown-out detection means for detecting when said waveform drops below a fixed minimum voltage;

sag detection means for detecting when said waveform decreases too quickly below a moving-average voltage established by said waveform; and logic gate means for providing a combined output pulse train based upon the output pulse train from each of said voltage detection means.

13. The apparatus according to claim 8 wherein power fail output signal is utilized for activating alternate power supply means in place of said AC line, thereby maintaining uninterrupted operation of said equipment.

14. An AC line-fail and brown-out voltage detection apparatus for uninterruptably maintaining operation of equipment utilizing a ferro-resonant transformer, said apparatus comprising in combination:

rectification means for providing a unipolar waveform having a magnitude proportional to the incoming AC line voltage and synchronized to the frequency thereof;

missing pulse detection means for normally receiving a pulse train and generating a power fail output signal upon receipt of a pulse train having a missing pulse;

switching means for switching said equipment from said ferro-resonant transformer to an alternate source of supply such as a backup battery upon receipt of said power fail output signal; and two-part voltage detection means interposed between said rectification means and said missing pulse detection means for detecting the magnitude and rate-of-decrease of said waveform with respect to fixed and dynamically determined limits and outputting a pulse train having a missing pulse when said waveform is below said limits, thereby providing a fast power fail output signal for maintaining uninterrupted operation of said equipment.

15. A circuit for detecting an AC line-fail and brown-out voltage condition for protecting equipment utilizing a ferro-resonant transformer, said circuit comprising in combination:

a rectifier circuit converting said AC line voltage into a proportional, unipolar, synchronous waveform;

a counter having a reset input, a clock input driven by a suitable timebase, and a disable input which is driven by an output of said counter; and a brown-out detector and a sag detector having a logic gate for combining the outputs thereof, and interposed between said rectifier circuit and said counter, said brown-out detector indicating that said waveform has dropped below a fixed minimum voltage and said sag detector indicating that said waveform has decreased too quickly below its moving-average reference voltage and outputting from said logic gate a pulse train having a missing pulse so as to delay resetting said counter, thereby providing a fast power fail output signal for protecting said equipment.

16. The circuit of claim 15 wherein said rectifier circuit includes a full-wave rectifier arrangement.

17. The circuit of claim 15 wherein said rectifier circuit includes a half-wave rectifier arrangement.

18. The circuit of claim 15 whereins said rectifier circuit includes at least one resistive divider network for providing a waveform proportional to said AC line voltage.

19. The circuit of claim 15 wherein said counter includes a Johnson ring counter.

20. The circuit of claim 15 wherein said timebase includes an oscillator.

21. The circuit of claim 15 wherein said timebase includes a high-frequency oscillator and a frequency divider.

22. The circuit of claim 15 wherein said timebase outputs a first frequency of approximately 484 Hertz to said counter.

23. The circuit of claim 15 wherein said timebase outputs a second frequency of approximately 124 kilohertz to said sag detector.

24. The circuit of claim 15 wherein said brown-out detector includes a voltage comparator having a present fixed reference voltage.

25. The circuit of claim 15, wherein said sag detector comprises an AGC loop having a slowly-changing variable-gain characteristic, including a variable-gain stage, a comparator coupled to an output of said variable-gain stage, an inverter coupled to an output of said comparator, and a fixed-delay monostable stage coupled to an output of said inverter, and an included network for establishing a moving average reference voltage based upon said waveform.

26. The circuit of claim 25 wherein said variable gain stage includes an amplifier and a variable attenuator.

27. The circuit of claim 25 wherein said monostable stage includes a counter having a reset input and a clock input which is driven from said timebase so as to effect a fixed delay of approximately 1 millisecond.

28. The circuit of claim 15, wherein said sag detector comprises an AGC loop having a slowly-changing variable-gain characteristic including a variable-gain stage, a comparator coupled to an output of said variable-gain stage, and a network for establishing a moving-average reference voltage which has temperature-compensating components, such as a zener diode and a thermistor.

29. The circuit of claim 15 wherein said sag detector comprises an AGC loop having a slowly-changing variable-gain characteristic including a variable-gain stage, a comparator coupled to an output of said variable-gain stage, and a network coupled to an output of said comparator for establishing a moving-average reference voltage.

30. The circuit for detecting an AC line-fail and brown-out voltage condition for uninterruptably maintaining operation of equipment utilizing a ferro-resonant transformer, said circuit comprising in combination:
   a rectifier circuit converting said AC line voltage into a proportional, unipolar synchronous waveform;
   a counter having a reset input, a clock input driven by a suitable timebase, and a disable input which is driven by the output of said counter;
   an electronic switch for electrically switching said equipment from said ferro-resonant transformer to an alternate source of supply such as a backup battery upon receiving said power fail output signal; and
   a brown-out detector and a sag detector having a logic gate for combining the outputs thereof, and interposed between said rectifier circuit and said counter,
   said brown-out detector indicating that said waveform has dropped below a fixed minimum voltage and said sag detector indicating that said waveform has decreased too quickly below its moving-average reference voltage and outputting from said logic gate a pulse train having a missing pulse so as to delay resetting said counter, thereby providing a fast power fail output signal for maintaining uninterrupted operation of said equipment.

31. A method of detecting an AC line-fail and brown-out voltage condition for protecting equipment utilizing a ferro-resonant transformer, said method comprising the steps of:
   rectifying said AC line voltage and providing a proportional, unipolar waveform synchronized thereto;
   monitoring a pulse train and generating a power fail output signal upon receipt of a pulse train having a missing pulse; and
   detecting the magnitude and rate-of-decrease of said waveform with respect to fixed and dynamically determined limits and outputting a pulse train having a missing pulse when said waveform is below said limits, thereby providing a fast power fail output signal for protecting said equipment.

32. The method of claim 31 wherein the step of rectifying said AC line voltage includes full-wave rectifying.

33. The method of claim 31 wherein the step of rectifying said AC line voltage includes half-wave rectifying.

34. The method of claim 31 wherein the step of monitoring a pulse train includes resetting a counter which continually counts the number of cycles of a timebase frequency and generates a power fail output signal only when said counter receives a pulse train having a missing pulse.

35. The method of claim 31 wherein the step of detecting the magnitude of said waveform includes comparing it to a fixed, minimum voltage and the step of detecting the rate-of-decrease in said waveform comprises comparing it to a moving-average voltage established by said waveform.

36. A method of detecting an AC line-fail and brown-out voltage condition for uninterruptably maintaining operation of equipment utilizing a ferro-resonant transformer, said method comprising the steps of:
   rectifying said AC line voltage and providing a proportional, unipolar waveform synchronized thereto;
   monitoring a pulse train and generating a power fail output signal upon receipt of a pulse train having a missing pulse;
   switching said equipment from said ferro-resonant transformer to an alternate source of supply such as a backup battery upon receiving said power fail output signal; and
   detecting the magnitude and rate-of-decrease of said waveform with respect to fixed and dynamically determined limits and outputting a pulse train having a missing pulse when said waveform is below said limits, thereby providing a fast power fail output signal for maintaining uninterrupted operation of said equipment.

* * * * *